United States Patent
Lee et al.

(10) Patent No.: US 10,424,603 B2
(45) Date of Patent: Sep. 24, 2019

(54) DISPLAY PANEL

(71) Applicant: Au Optronics Corporation, Hsinchu (TW)

(72) Inventors: Cheng-Chieh Lee, Hsinchu (TW); Chao-Chien Chiu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/009,243

(22) Filed: Jun. 15, 2018

(65) Prior Publication Data

US 2019/0252411 A1    Aug. 15, 2019

(30) Foreign Application Priority Data

Feb. 9, 2018    (TW) .............................. 107104830 A

(51) Int. Cl.
| | |
|---|---|
| *H01L 27/12* | (2006.01) |
| *G02F 1/1362* | (2006.01) |
| *G02F 1/1368* | (2006.01) |

(52) U.S. Cl.
CPC ........ *H01L 27/124* (2013.01); *H01L 27/1218* (2013.01); *G02F 1/1368* (2013.01); *G02F 1/136286* (2013.01); *G02F 2001/13629* (2013.01); *G02F 2201/56* (2013.01)

(58) Field of Classification Search
CPC .............. H01L 27/142; H01L 27/1218; G02F 2001/13629; G02F 1/1368; G02F 1/136286; G02F 2201/05
See application file for complete search history.

(56) References Cited

U.S. PATENT DOCUMENTS

| | | | |
|---|---|---|---|
| 7,589,703 B2* | 9/2009 | Su ....................... | G09G 3/3648 345/103 |
| 2006/0050192 A1* | 3/2006 | Cho .................. | G02F 1/136286 349/42 |

(Continued)

FOREIGN PATENT DOCUMENTS

| | | |
|---|---|---|
| CN | 106647066 | 5/2017 |
| CN | 106843389 | 6/2017 |

(Continued)

*Primary Examiner* — Dale E Page
*Assistant Examiner* — Quovaunda Jefferson
(74) *Attorney, Agent, or Firm* — JCIPRNET

(57) ABSTRACT

A display panel having a notch extending inwardly from its edge and including a plurality of first signal lines having a first extending direction, a plurality of second signal lines having a second extending direction different from the first extension direction, a plurality of pixel units, and a plurality of transmission lines is provided. The pixel units are electrically connected to the first signal lines and the second signal lines. The transmission lines are electrically connected to the first signal lines. Part of the transmission lines includes a first sub-transmission line, a second sub-transmission line and a third sub-transmission line electrically connected to each other. The first sub-transmission line is disposed between the adjacent second signal lines. The second sub-transmission line is disposed between the adjacent first signal lines. The third sub-transmission line overlaps another transmission line in the second extending direction.

20 Claims, 7 Drawing Sheets

(56) References Cited

U.S. PATENT DOCUMENTS

| 2011/0085122 A1* | 4/2011 | Fu ........................ G02F 1/13338 |
| | | 349/149 |
| 2016/0202581 A1* | 7/2016 | Yu ..................... G02F 1/134309 |
| | | 257/72 |
| 2018/0196475 A1 | 7/2018 | Bao et al. |

FOREIGN PATENT DOCUMENTS

| JP | H11305681 | 11/1999 |
| TW | I489185 | 6/2015 |

* cited by examiner

DISPLAY PANEL

CROSS-REFERENCE TO RELATED APPLICATION

This application claims the priority benefit of Taiwan application serial no. 107104830, filed on Feb. 9, 2018. The entirety of the above-mentioned patent application is hereby incorporated by reference herein and made a part of this specification.

BACKGROUND OF THE INVENTION

1. Field of the Invention

The invention relates to a display panel, and particularly relates to a display panel having a great number of pixel units.

2. Description of Related Art

Owing to the continuous development of science and technology, image display panels are found everywhere in the modern society, and are broadly applied in various electronic products, such as smart mobile phones, personal digital assistants, tablet computers, or virtual reality (VR) apparatuses. To pursue a more desirable image display quality and visual effect, the design of display panels nowadays generally focuses on how to design a large display region out of a limited substrate space. One way to obtain a larger display region is to reduce the electronic components in an integrated circuit or modify the arrangement of the electronic components to reduce the area of a non-display region and relatively enlarge the display region, so that the image display region may be greater.

Taking liquid crystal displays (LCDs) as an example, the pixel array in an LCD generally includes active devices and a plurality of conductive wires in an interlacing arrangement. In order to connect the conductive wires to a driving device region in the non-display region and obtain signals for driving pixels, it is common to preserve some space around the pixel array. By disposing the conductive wires in the space, the driving device is able to transmit signals to the pixel array. However, such arrangement of the conductive wires also makes the non-display region larger. Following the line of thinking above, how to modify the arrangement of the conductive wires or reduce the number of the conductive wires in the pixel array to make the non-display region smaller and thereby obtain a larger display region has become an issue to work on in the design of display panels.

SUMMARY OF THE INVENTION

One or some exemplary embodiments of the invention provide a display panel that may be integrated with other electronic devices.

One or some exemplary embodiments of the invention provide a display panel having a desirable space usage.

One or some exemplary embodiments of the invention provide a display panel that may be rendered as a full-screen display panel.

A display panel according to an embodiment of the invention has a notch extending inwardly from an edge of the display panel. The display panel includes a substrate, a plurality of first signal lines, a plurality of second signal lines, a plurality of pixel units, and a plurality of transmission lines. The first signal lines are disposed on the substrate and have a first extending direction. The second signal lines are disposed on the substrate and have a second extending direction. The first signal lines are located between the substrate and the second signal lines. The first extending direction is different from the second extending direction. The pixel units are disposed on the substrate and electrically connected with the corresponding first signal lines and the corresponding second signal lines. The transmission lines are disposed on the substrate and electrically connected with the corresponding first signal lines. Part of the transmission lines includes a first sub-transmission line, a second sub-transmission line and a third sub-transmission line. The first sub-transmission line is disposed between the adjacent second signal lines. The second sub-transmission line is electrically connected to the first sub-transmission line. The second sub-transmission line is disposed between the adjacent first signal lines. The third sub-transmission line is electrically connected to the second sub-transmission line. The third sub-transmission line is overlapped with one of remaining of the transmission lines in the second extending direction.

A display panel according to an embodiment of the invention has a notch extending inwardly from an edge of the display panel. The display panel includes a substrate, a plurality of first signal lines, a plurality of second signal lines, a plurality of pixel units, and a plurality of transmission lines. The first signal lines are disposed on the substrate and have a first extending direction. The second signal lines are disposed on the substrate and have a second extending direction. The second signal lines are located between the substrate and the first signal lines. The first extending direction is different from the second extending direction. The pixel units are disposed on the substrate and electrically connected with the corresponding first signal lines and the corresponding second signal lines. The transmission lines are disposed on the substrate and electrically connected with the corresponding first signal lines. Part of the transmission lines includes a first sub-transmission line, a second sub-transmission line and a third sub-transmission line. The first sub-transmission line is disposed between the adjacent second signal lines. The second sub-transmission line is electrically connected to the first sub-transmission line. The second sub-transmission line is disposed between the adjacent first signal lines. The third sub-transmission line is electrically connected to the second sub-transmission line. The third sub-transmission line is overlapped with one of remaining of the transmission lines in the second extending direction.

Based on the above, the display panel according to the embodiments of the invention has a notch and thus may be integrated with other electronic device. In addition, part of the transmission lines may be overlapped with other transmission lines. Therefore, the space usage of the display panel may be facilitated and the display panel may thus be rendered as a full-screen display panel.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings

DESCRIPTION OF THE EMBODIMENTS

Figure 1A:
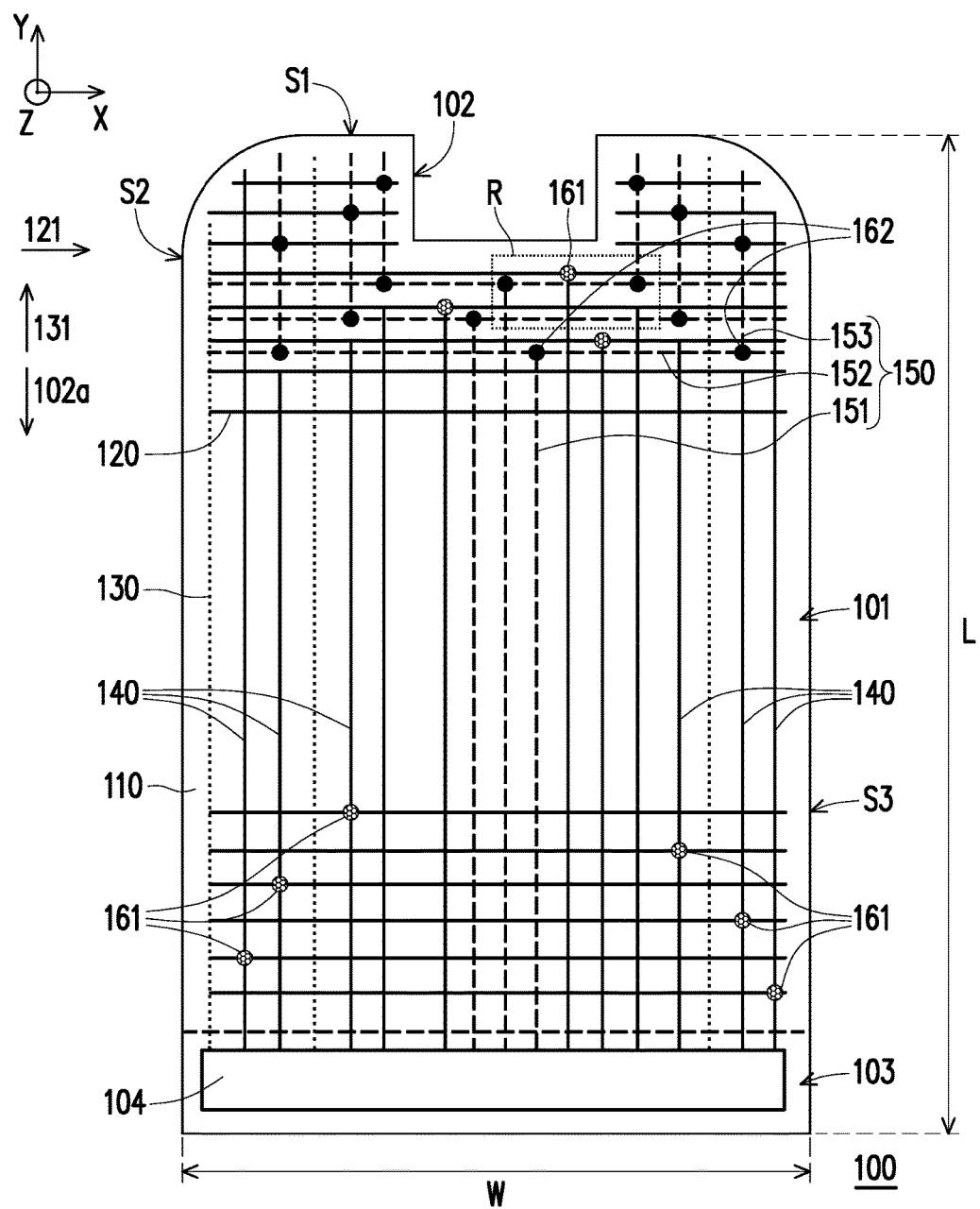
FIG. 1A is a schematic top view illustrating a display panel according to a first embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
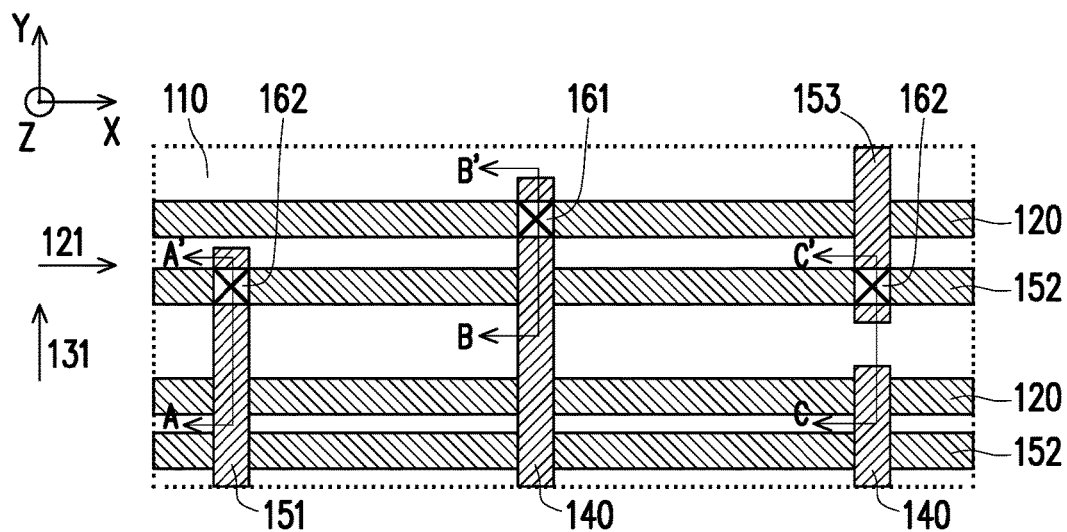
FIG. 1B is an enlarged view illustrating a region R in FIG. 1A.
Figure 1C:
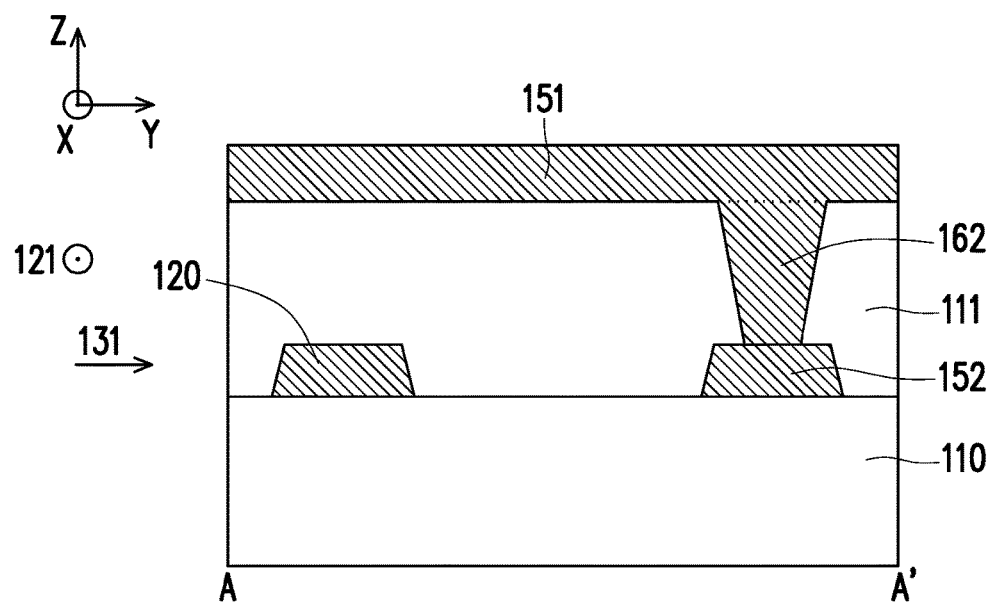
FIG. 1C is a schematic cross-sectional view taken along a cross-sectional line A-A' of FIG. 1B.
Figure 1D:
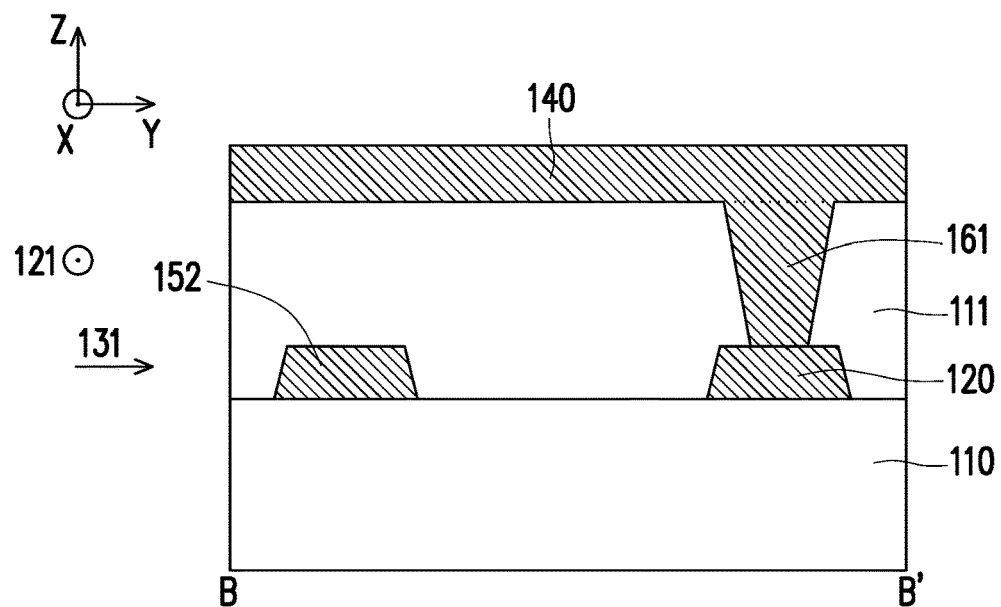
FIG. 1D is a schematic cross-sectional view taken along a cross-sectional line B-B' of FIG. 1B.
Figure 1E:
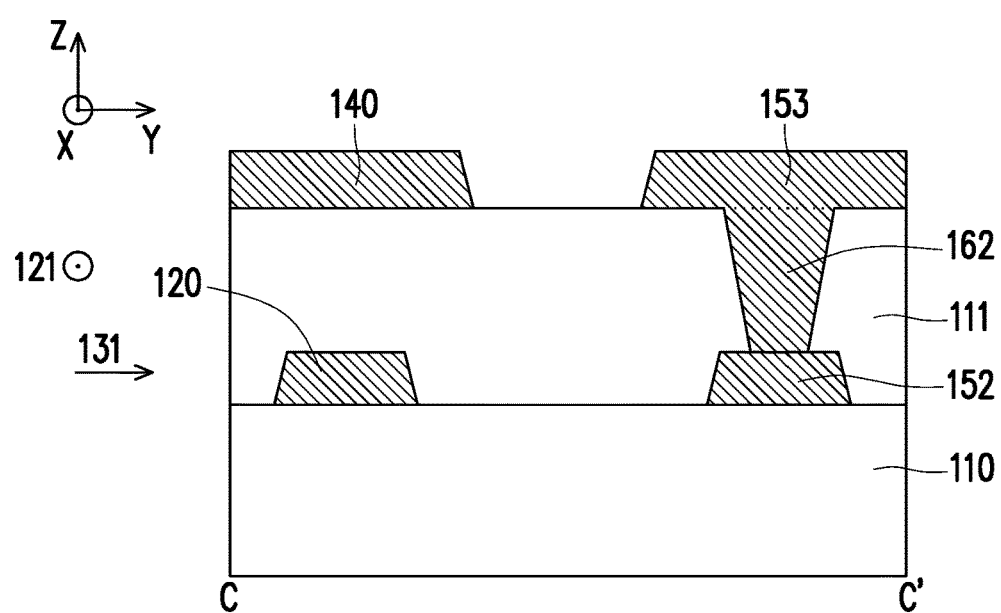
FIG. 1E is a schematic cross-sectional view taken along a cross-sectional line C-C' of FIG. 1B.
Figure 1F:
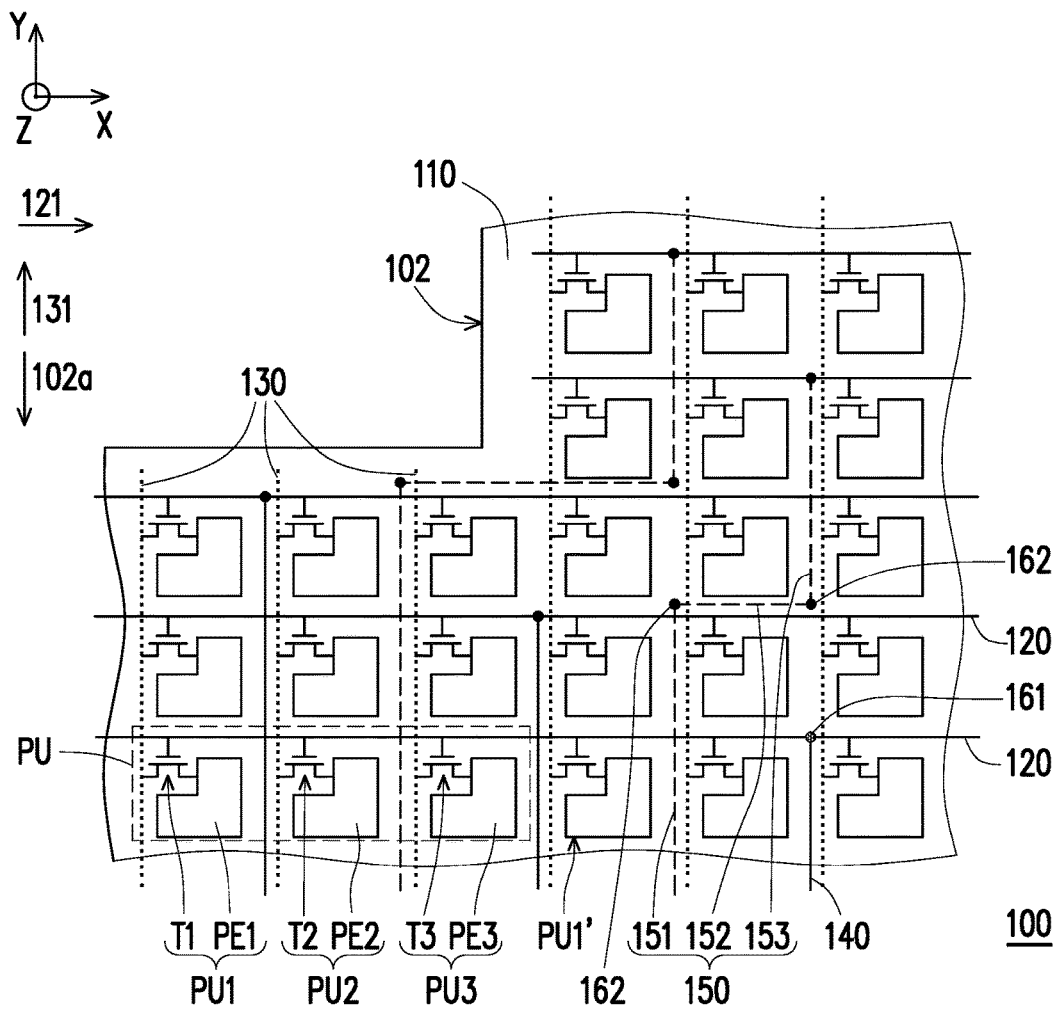
FIG. 1F is a partial circuit diagram illustrating the region R in FIG. 1A.

FIG. 1A is a schematic top view illustrating a display panel according to a first embodiment of the invention. FIG. 1B is an enlarged view illustrating a region R in FIG. 1A. FIG. 1C is a schematic cross-sectional view taken along a cross-sectional line A-A' of FIG. 1B. FIG. 1D is a schematic cross-sectional view taken along a cross-sectional line B-B' of FIG. 1B. FIG. 1E is a schematic cross-sectional view taken along a cross-sectional line C-C' of FIG. 1B. For the clarity of illustration, FIGS. 1A to 1E only schematically illustrate some layers or devices of the display panel. FIG. 1F is a partial circuit diagram illustrating the region R in FIG. 1A, where a driving configuration of the display panel in a vicinity of a notch is described in the form of a circuit diagram.

Referring to FIGS. 1A to 1F, a display panel 100 has a display region 101 and a device region 103 connected with the display region 101. In addition, a notch 102 is provided on an edge S1 of the display region 101. The notch 102 extends inwardly from the edge S1 of the display region 101. Therefore, if the display panel 100 is disposed in an electronic apparatus, such as a smart mobile phone, a personal digital assistant, a tablet computer, or a virtual reality (VR) apparatus, other electronic devices (e.g., an optical sensor) may be disposed at the notch 102. Accordingly, the display panel 100 with the notch 102 may be integrated with other electronic devices.

In addition, the display panel 100 includes a substrate 110, a plurality of first signal lines 120, a plurality of second signal lines 130, a plurality of transmission lines 140 and 150, a plurality of pixel units PU, a dielectric layer 111, and a driving chip 104. The first signal lines 120, the second signal lines 130, the transmission lines 140 and 150, the pixel units PU, and the dielectric layer 111 are located on the substrate 110. The first signal lines 120 are located in the display region 101 and may have a first extending direction 121. The second signal lines 130 extend from the device region 103 to the display region 101 and may have a second extending direction 131. In addition, the first extending direction 121 is different from the second extending direction 131. In brief, the first signal lines 120 and the second signal lines 130 may be separated by the dielectric layer and be arranged to cross each other.

In the embodiment, the notch 102 is located on the edge S1 of the display region 101 with respect to the device region 103. An extending direction 102a of the notch 102 is substantially parallel to the second extending direction 131, and the notch 102 extends inwardly in the display region 101. However, the invention is not limited thereto. In other embodiments, the position, the shape, and/or the extending direction of the notch 102 may be adjusted based on design requirements, and corners of the notch 102 may be curved, but the notch 102 is arranged to be away from the device region 103.

In the embodiment, the first extending direction 121 is perpendicular to the second extending direction 131, for example. The first extending direction 121 is the X direction, for example, and the second extending direction 131 is the Y direction, for example. However, the invention is not limited thereto.

In the embodiment, a dimension (i.e., a width W) of the display panel 100 in the first extending direction 121 is less than a dimension (i.e., a length L) of the display panel 100 in the second extending direction 131. In other words, if the notch 102 on the display panel 100 is ignored, the shape of the display panel 100 is substantially rectangular, for example. However, the invention is not limited thereto.

In the embodiment, the first signal lines 120 are scan lines, for example, the second signal lines 130 are data lines, for example, and each of the pixel units PU includes a plurality of active devices T1, T2, and T3 and a plurality of pixel electrodes PE1, PE2, and PE3. In addition, the active devices T1, T2, and T3 are thin film transistors (TFTs), for example. In other embodiments, the first signal lines 120 may be data lines, the second signal lines 130 may be scan lines, the active devices T1, T2, and T3 may be active devices of other forms, and the first signal lines 120, the second signal lines 130, and the active devices T1, T2, and T3 are not limited to the configuration described in the embodiment. The first signal lines 120, the second signal lines 130, and the pixel units PU form a pixel array in the display region 101 and are configured to display an image.

In general, to render a colored frame, sub-pixels PU1, PU2, and PU3 of different colors need to be further distinguished in the display panel 100, so as to form a desired image on the display panel 100 by arranging different colors. In the embodiment, each of the pixel units PU includes the first sub-pixel PU1, the second sub-pixel PU2, and the third sub-pixel PU3. The first sub-pixel unit PU1 includes the first active device T1 and the first pixel electrode PE1 electrically connected to the first active device T1. The second sub-pixel unit PU2 includes the second active device T2 and the second pixel electrode PE2 electrically connected to the second active device T2. The third sub-pixel unit PU3 includes the third active device T3 and the third pixel electrode PE3 electrically connected to the third active device T3. In the embodiment, the first sub-pixel PU1, the second sub-pixel PU2, and the third sub-pixel PU3 may be sequentially arranged along the first extending direction 121. In addition, the first sub-pixel PU1, the second sub-pixel PU2, and the third sub-pixel PU3 may emit light of different colors (e.g., green light, red light, and blue light).

In FIG. 1F, one of the first signal line 120 is electrically connected to the first active device T1, the second active device T2, and the third active device T3 of the same pixel unit PU, and the first active device T1, the second active device T2, and the third active device T3 of the same pixel unit PU are respectively electrically connected with different second signal lines 130. Taking the display panel 101 as a TFT liquid crystal display (TFT-LCD) panel as an example, in a process of displaying an image, the first signal lines 120 (as scan lines in the embodiment) turn on the corresponding active devices T1, T2, and T3 based on driving signals, and the second signal lines (as data lines in the embodiment) input data voltages from the active devices T1, T2, and T3 to the corresponding pixel electrodes PE1, PE2, and PE3 to change the arrangement of corresponding liquid crystal molecules and thereby change grayscale levels of the sub-pixels PU1, PU2, and PU3. With the first signal lines 120 alternately scanning the pixel units PU and the data voltages being input through the corresponding second signal lines 130, different sub-pixels PU1, PU2, and PU3 in the respective pixel units PU may be operated.

Electronic signals in the first signal lines 120 and the second signal lines 130 are provided by the driving chip 104 disposed in the device region 103. In the embodiment, the driving chip 104 is electrically connected to the second signal lines 130 and the transmission lines 140 and 150. The respective first signal lines 120 may be electrically connected with the corresponding transmission lines 140 and 150 via corresponding connection nodes 161 and 162. Structurally, the connection nodes 161 and 162 are conductive vias, for example.

The transmission lines 140 and 150 include first transmission lines 140 and second transmission lines 150. The first transmission line 140 extends from the device region 103 to the display region 101 along the second extending direction 131. The second transmission line 150 includes a first sub-transmission line 151, a second sub-transmission line 152, and a third sub-transmission line 153. The first sub-transmission line 151 and the third sub-transmission line 153 extend in the second extending direction 131, and the second sub-transmission line 152 extends in the first extending direction 121. The first sub-transmission line 151 extends from the device region 103 to the display region 101, and the second sub-transmission line 152 and the third sub-transmission line 153 are located in the display region 101.

In the embodiment, the first signal lines 120 are located between the substrate 110 and the second signal lines 130. The first signal lines 120 and the second sub-transmission lines 152 are located at the same layer. The second signal lines 130, the first transmission lines 140, the first sub-transmission lines 151, and the third sub-transmission lines 153 are located at the same layer. The first transmission lines 140 and part of the first signal lines 120 are electrically connected to each other via the first connection nodes 161. The first sub-transmission lines 151 and the second sub-transmission lines 152, the second sub-transmission lines 152 and the third sub-transmission lines 153, and the third sub-transmission lines 153 and other part of the first signal lines are electrically connected to each other via the second connection nodes 162.

In the embodiment, the first connection nodes 161 are line-symmetrically arranged on two sides with respect to a virtual line (e.g., a central line of the width W of the display panel 100), and the virtual line is parallel to the second extending direction 131. In other words, the first connection nodes 161 are in a line-symmetrical arrangement in the display region 101. In the embodiment shown in FIG. 1A, the first connection nodes 161 arranged to form a pattern of an inverted V or U in the display region 101, and the opening of the inverted V or U is toward the device region 103. However, the invention is not limited thereto.

In the second extending direction 131, the third sub-transmission 153 is overlapped with one of the first transmission lines 140 or the first sub-transmission line 151 of another second transmission line 150. For example, on a virtual surface perpendicular to the second extending direction 131 (e.g., the XZ plane of FIGS. 1A to 1F, a projection area of the third sub-transmission line 153 on the virtual surface is overlapped with a projection area of one of the first transmission lines 140 on the virtual surface. Alternatively, the projection area of the third sub-transmission line 153 on the virtual surface is overlapped with a projection area of the first sub-transmission line 151 of another second transmission line 150 on the virtual surface.

Figure 1G:
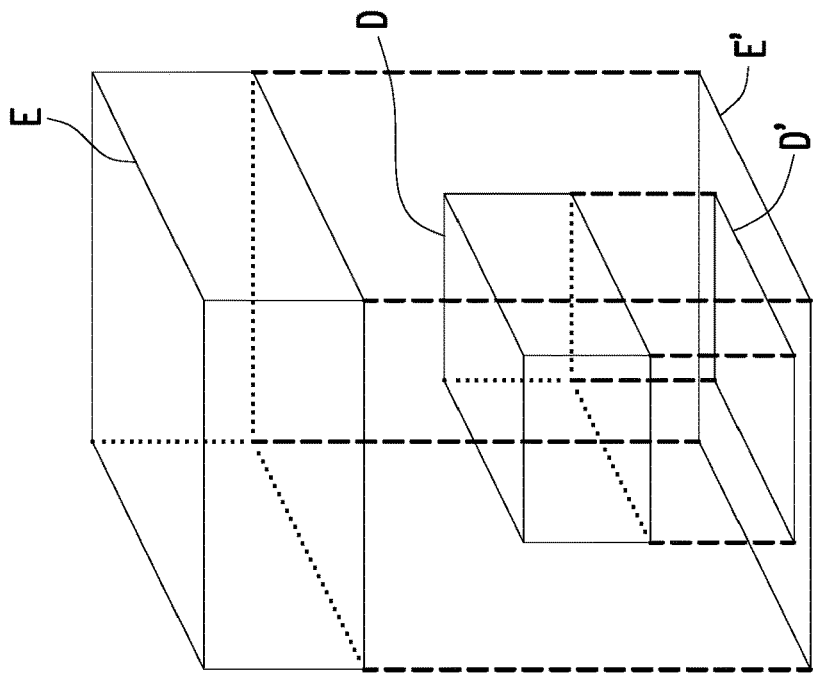
FIGS. 1G and 1H are schematic perspective views illustrating that two objects are completely overlapped.
Figure 1H:
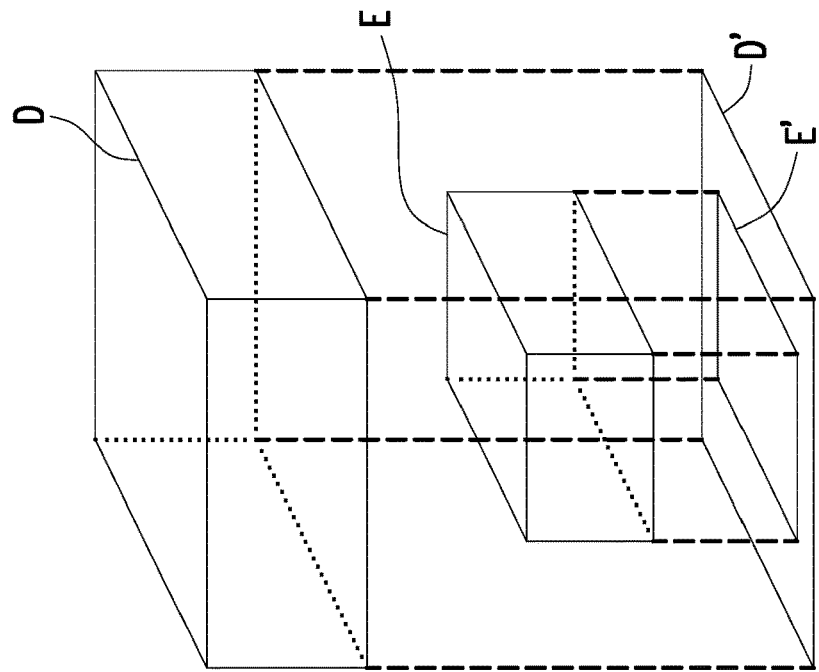

In the embodiment, in the second extending direction 131, the third sub-transmission line 153 may be completely overlapped with the corresponding first transmission line 140, or the third sub-transmission line 153 may be completely overlapped with the first sub-transmission line 151 of another second transmission line 150. In the disclosure, "completely overlapped" is defined as follows. If an object D and an object E are completely overlapped with each other, a vertical projection D' of the object D is completely located in or completely coincides with a vertical projection E' of the object E (as shown in FIG. 1G), or the vertical projection E' of the object E is completely located in or completely coincides with the vertical projection D' of the object D (as shown in FIG. 1H). For example, in FIG. 1G or 1F, the object D may be the third sub-transmission line 153, and the object E may be the corresponding first transmission line 150 of the corresponding first sub-transmission line 151 of another second transmission line 150.

Specifically, in terms of the circuit arrangement of the display panel 100, part of the first transmission lines 140/the first sub-transmission lines 151 extend from the device region 103 to the display region 101. In addition, the first transmission lines 140/the first sub-transmission lines 152 may be refrained from further extending after being electrically connected to the corresponding first signal lines 120/the corresponding second sub-transmission lines 152. In other words, it is not necessary for the first transmission lines 140/the first sub-transmission lines 151 to extend to the edge S1 of the display region 101 relative to the device region 103. Therefore, in the second extending direction 131 of the display region 101, the third sub-transmission line 153 of another second transmission line 150 may be disposed in a region where the first transmission line 140/the first sub-transmission line 151 is refrained from further extending. In other words, in the first extending direction 121, one of the second signal lines 130 and one of arbitrary one of the first transmission lines 140, arbitrary one of the first sub-transmission lines 151, and arbitrary one of the third sub-transmission lines 153 may be arranged between two adjacent sub-pixels of the sub-pixels PU1, PU2, and PU3 (e.g., between the first sub-pixel PU1 and the second sub-pixel PU2 of the same pixel unit PU, the second sub-pixel PU2 and the third sub-pixel PU3 of the same pixel unit PU, or the third pixel unit PU3 of the pixel unit PU and a first sub-pixel PU1' of another closest pixel unit). Accordingly, a distance between two adjacent pixel units PU and/or two adjacent sub-pixels of the sub-pixels PU1, PU2, and PU3 may be reduced, and the space usage of the display panel 100 may be facilitated. Consequently, the dots per inch (dpi) of the display panel 100 may also be facilitated.

Besides, with the arrangement, the second signal lines 130, the first transmission lines 140, the first sub-transmission lines 151, the second sub-transmission lines 152, and/or the third sub-transmission lines 153 may be located between two adjacent pixel units PU or be overlapped with the pixel units PU. However, if the second signal line 130, the first transmission line 140, the first sub-transmission line 151, and/or the third sub-transmission line 153 is the wire closest to the edge S2, the edge S3, or the notch 102 of the display panel 100, the second signal line 130, the first transmission line 140, the first sub-transmission line 151, and/or the third sub-transmission line 153 may be overlapped with the pixel unit PU. Therefore, the second signal line 130, the first transmission line 140, the first sub-transmission line 151, and/or the third sub-transmission line 153 may be refrained from being arranged on the edge S2, the edge S3, or the notch 102 of the display panel 100 parallel to the second extending direction 131, and the display panel 100 may be rendered as a full-screen display panel.

In some embodiments, in the first extending direction 121, part of the pixel units PU located on two opposite sides of the notch 102 are electrically connected with the corresponding second transmission lines 150. In other words, the pixel units PU away from the device region 103 may be electrically connected with the driving chip 104 via the second transmission lines 150. Accordingly, the space usage of the display panel 100 is facilitated.

Figure 2:
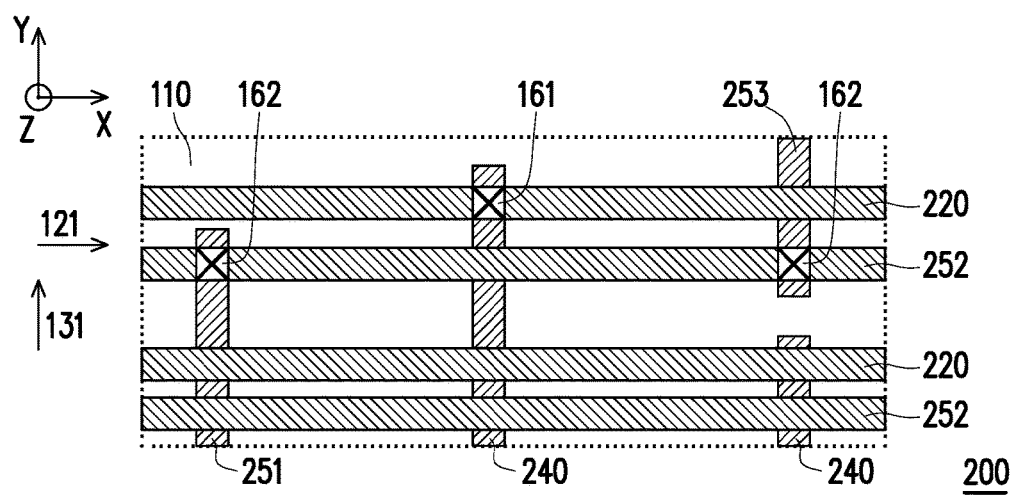
FIG. 2 is a partial schematic top view illustrating a display panel according to a second embodiment of the invention.

FIG. 2 is a partial schematic top view illustrating a display panel according to a second embodiment of the invention. For clearer illustration, FIG. 2 only illustrates an enlarged view of a portion of the display panel, similar to the region R in FIG. 1A. Referring to FIGS. 1A to 2, a display panel 200 of the embodiment is similar to the display panel 100 of the previous embodiment, but differs in that the second signal lines (not shown) are located between the substrate 110 and first signal lines 220. The second signal lines, first transmission lines 240, first sub-transmission lines 251, and third sub-transmission lines 253 are located at the same layer. The first signal lines 220 and the second sub-transmission lines 252 are located at the same layer.

Figure 3:
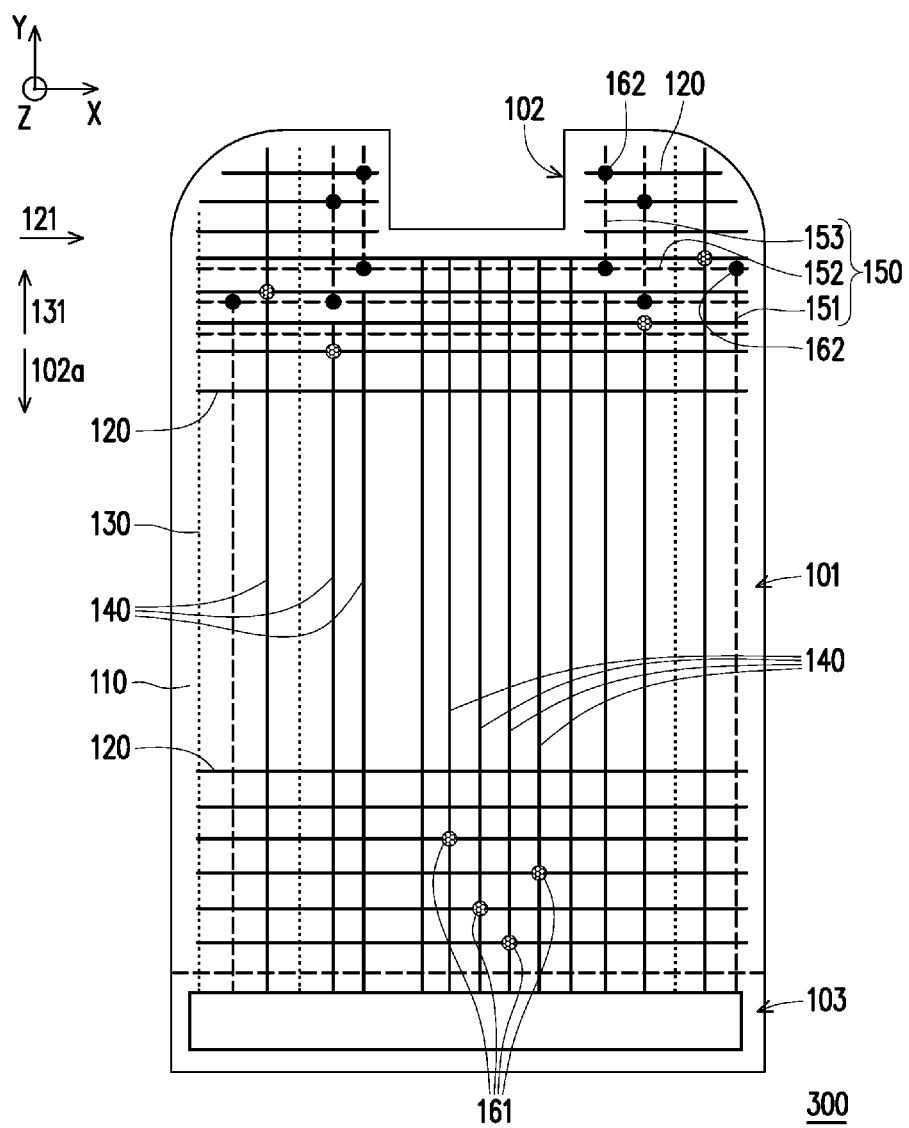
FIG. 3 is a schematic top view illustrating a display panel according to a third embodiment of the invention.

FIG. 3 is a schematic top view illustrating a display panel according to a third embodiment of the invention. In a display panel 300 shown in FIG. 3, first connection nodes 161 are arranged in the display region 101 to form a pattern of V/U, and the opening of the V or U is toward the notch 102.

In view of the foregoing, in the display panels according to the embodiments of the invention, the pixel unit having the sub-pixels is driven by the first signal line and the second signal lines. The first signal line is electrically connected with the corresponding transmission lines, and the second signal lines and the transmission lines may be located at or overlapped with the pixel units. Therefore, the display panel according to the embodiments of the invention may be rendered as a full-screen display panel. Besides, in terms of the circuit arrangement of the display panel, part of the transmission lines are bent. In addition, in the extending direction of the second signal lines, part of the transmission lines may be overlapped with other transmission lines. Therefore, the space usage of the display panel may be facilitated, and the dpi of the display panel may thereby be facilitated.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A display panel, having a notch extending inwardly from an edge of the display panel, the display panel comprising:
a substrate;
a plurality of first signal lines, disposed on the substrate and having a first extending direction;
a plurality of second signal lines, disposed on the substrate and having a second extending direction, wherein the first signal lines are located between the substrate and the second signal lines, and the first extending direction is different from the second extending direction;
a plurality of pixel units, disposed on the substrate and electrically connected with the corresponding first signal lines and the corresponding second signal lines; and
a plurality of transmission lines, disposed on the substrate and electrically connected with the corresponding first signal lines, wherein part of the transmission lines comprise:
a first sub-transmission line, located between the adjacent second signal lines;
a second sub-transmission line, electrically connected to the first sub-transmission line and located between the adjacent first signal lines; and
a third sub-transmission line, electrically connected to the second sub-transmission line and overlapped with one of remaining of the transmission lines in the second extending direction.

2. The display panel as claimed in claim 1, wherein the third sub-transmission line is completely overlapped with the one of the remaining of the transmission lines.

3. The display panel as claimed in claim 1, wherein an extending direction of the notch is parallel to the second extending direction.

4. The display panel as claimed in claim 1, wherein the first signal lines and the second sub-transmission lines are located at the same layer, and the second signal lines, the first sub-transmission lines and the third sub-transmission lines are located at the same layer.

5. The display panel as claimed in claim 1, wherein the transmission lines comprise a plurality of first transmission lines and a plurality of second transmission lines, each of the first transmission lines is located between the adjacent second signal lines, and each of the second transmission lines comprises the first sub-transmission line, the second sub-transmission line, and the third sub-transmission line.

6. The display panel as claimed in claim 5, wherein in the first extending direction, part of the pixel units located on two opposite sides of the notch are electrically connected with the corresponding second transmission lines.

7. The display panel as claimed in claim 1, wherein each of the pixel units comprises:
a first active device;
a first pixel electrode, electrically connected to the first active device;
a second active device;
a second pixel electrode, electrically connected to the second active device;
a third active device; and
a third pixel electrode, electrically connected to the third active device, wherein:
the first active device, the second active device, and the third active device are commonly electrically connected to one of the first signal lines, and the first active device, the second active device, and the third active device are respectively electrically connected to three of the second signal lines.

8. The display panel as claimed in claim 7, wherein the first pixel electrode, the second pixel electrode, and the third pixel electrode are sequentially arranged along the first extending direction, and the corresponding transmission lines are disposed between the first pixel electrode and the second pixel electrode or between the second pixel electrode and the third pixel electrode.

9. The display panel as claimed in claim 7, wherein the transmission lines comprise a plurality of first transmission lines and a plurality of second transmission lines, each of the first transmission lines is located between the adjacent second signal lines, and each of the second transmission lines comprises the first sub-transmission line, the second sub-transmission line, and the third sub-transmission line.

10. The display panel as claimed in claim 9, wherein a first connection node is provided at where each of the first transmission lines is electrically connected with a corresponding first signal line of the first signal lines, and the first nodes are in a line-symmetrical arrangement in a display region.

11. The display panel as claimed in claim 1, wherein a dimension of the display panel in the first extending direction is less than a dimension of the display panel in the second extending direction.

12. The display panel as claimed in claim 1, wherein the display panel has a display region and a device region connected with the display region, the pixel units are located in the display region, and the notch extends from an edge of the display region toward the device region.

13. The display panel as claimed in claim 12, wherein the second signal lines and the transmission lines extend from the device region to the display region.

14. The display panel as claimed in claim 13, wherein the first sub-transmission line extends from the device region to the display region, and the second sub-transmission line and the third sub-transmission line are located in the display region.

15. The display panel as claimed in claim 12, further comprising:
a driving chip, located in the device region and driving the corresponding pixel units through the second signal lines and the transmission lines.

16. The display panel as claimed in claim 1, wherein:
the second signal lines and the transmission lines are located between two corresponding pixel units of the pixel units, and/or
the second signal lines and the transmission lines are overlapped with the corresponding pixel units.

17. The display panel as claimed in claim 1, wherein the first signal lines are respectively a plurality of scan lines, and the second signal lines are respectively a plurality of data lines.

18. The display panel as claimed in claim 1, wherein the first signal lines are respectively a plurality of data lines, and the second signal lines are respectively a plurality of scan lines.

19. A display panel, having a notch extending inwardly from an edge of the display panel, the display panel comprising:
a substrate;
a plurality of first signal lines, disposed on the substrate and having a first extending direction;
a plurality of second signal lines, disposed on the substrate and having a second extending direction, wherein the second signal lines are located between the substrate and the first signal lines, and the first extending direction is different from the second extending direction;
a plurality of pixel units, disposed on the substrate and electrically connected with the corresponding first signal lines and the corresponding second signal lines; and
a plurality of transmission lines, disposed on the substrate and electrically connected with the corresponding first signal lines, wherein part of the transmission lines comprise:
a first sub-transmission line, located between the adjacent second signal lines;
a second sub-transmission line, electrically connected to the first sub-transmission line and located between the adjacent first signal lines; and
a third sub-transmission line, electrically connected to the second sub-transmission line and overlapped with one of remaining of the transmission lines in the second extending direction.

20. The display panel as claimed in claim 19, wherein the third sub-transmission line is completely overlapped with the one of the remaining of the transmission lines.

* * * * *